(12) United States Patent
Mitsuhashi et al.

(10) Patent No.: US 7,754,275 B2
(45) Date of Patent: Jul. 13, 2010

(54) DEVICE, METHOD FOR MANUFACTURING DEVICE, AND METHOD FOR FORMING FILM

(75) Inventors: Etsuo Mitsuhashi, Chino (JP); Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 501 days.

(21) Appl. No.: 11/733,623

(22) Filed: Apr. 10, 2007

(65) Prior Publication Data

US 2007/0269621 A1 Nov. 22, 2007

(30) Foreign Application Priority Data

May 19, 2006 (JP) .............................. 2006-140207

(51) Int. Cl.
*B05D 5/06* (2006.01)
*B05D 3/00* (2006.01)
*H05H 1/00* (2006.01)

(52) U.S. Cl. .......................... 427/66; 427/271; 427/535

(58) Field of Classification Search ................... 427/66, 427/256, 258, 269, 286, 271–273
See application file for complete search history.

(56) References Cited

U.S. PATENT DOCUMENTS

| 7,015,503 | B2 | 3/2006 | Seki et al. |
| 7,214,959 | B2 | 5/2007 | Seki et al. |
| 7,273,801 | B2 | 9/2007 | Seki et al. |
| 2002/0021085 | A1* | 2/2002 | Ng .............................. 313/499 |
| 2004/0017152 | A1* | 1/2004 | Hashimoto et al. .......... 313/505 |
| 2004/0222429 | A1* | 11/2004 | Yamazaki et al. ............. 257/79 |
| 2005/0023969 | A1* | 2/2005 | Omata et al. ................. 313/504 |
| 2005/0186403 | A1* | 8/2005 | Seki et al. ................ 428/195.1 |
| 2005/0247934 | A1* | 11/2005 | Kitakado et al. .............. 257/59 |
| 2006/0164742 | A1* | 7/2006 | Katagami et al. ........... 359/895 |
| 2006/0197086 | A1* | 9/2006 | Rhee et al. .................... 257/59 |

FOREIGN PATENT DOCUMENTS

| JP | A-2001-291583 | 10/2001 |
| JP | A-2002-056980 | 2/2002 |
| JP | A-2002-372921 | 12/2002 |
| JP | A-2004-103502 | 4/2004 |
| JP | A-2004-235128 | 8/2004 |
| JP | A-2005-093421 | 4/2005 |
| JP | A-2006-221839 | 8/2006 |
| JP | A-2007-128688 | 5/2007 |

* cited by examiner

*Primary Examiner*—Timothy H Meeks
*Assistant Examiner*—James Lin
(74) *Attorney, Agent, or Firm*—Oliff & Berridge, PLC

(57) ABSTRACT

A device includes a bank, a film disposed in a region surrounded by the bank, and a groove extending along the periphery of the region. A method for forming a film by providing a liquid containing a functional material in a region surrounded by a bank includes forming a groove extending along the periphery of the region, providing the liquid in the region, and drying the liquid to form the film. The film is made of the functional material and is disposed over the groove. A method for manufacturing a device includes forming a film by providing a liquid in a region surrounded by a bank, the film being formed by the film-forming method.

11 Claims, 9 Drawing Sheets

DEVICE, METHOD FOR MANUFACTURING DEVICE, AND METHOD FOR FORMING FILM

BACKGROUND

1. Technical Field

The present invention relates to a device, a method for manufacturing such a device, and a method for forming a film.

2. Related Art

In recent years, liquid-phase processes for manufacturing electronic devices are being developed. The following documents disclose techniques for depositing materials, such as hole injection materials and luminescent materials, for forming organic electroluminescent (EL) devices on base members by droplet-ejecting processes: JP-A-2001-291583 (hereinafter referred to as Patent Document 1), JP-A-2002-56980 (hereinafter referred to as Patent Document 2), and JP-A-2004-235138 (hereinafter referred to as Patent Document 3).

FIGS. 15A and 15B schematically illustrates a known method for forming a film by a droplet-ejecting process. In the known method, as shown in FIG. 15A, a bank B is formed around a region for forming a film F. After the bank B is surface-treated to be lyophobic using CF4 plasma or the like, a liquid L containing a functional material is provided in the region surrounded by the bank B. The liquid L is then dried, whereby the film F containing the functional material is formed as shown in FIG. 15B.

Since the film F is formed using the bank B, there is a problem in that the film F has raised end portions F2 and F3 as shown in FIG. 15B and therefore is nonuniform. This is probably as described below. In general, edge portions of liquid droplets placed on base members are more quickly dried than inner portions thereof. Therefore, during the drying of each liquid droplet, the concentration of a solute in the edge portion of the liquid droplet first reaches saturation; hence the solute precipitates. In the inner portion of the liquid droplet, a solvent contained in the liquid droplet flows from a center portion of the liquid droplet to the edge portion such that the loss of the solvent is compensated. The solute in the center portion is transported to the edge portion by the solvent flow. The vaporization, of the solvent from the edge portion causes the salute to precipitate in the edge portion. If such a flow is created in the region surrounded by the bank B, surface portions of the film F that located near the bank B are raised and therefore the film F has an M or U shape in cross section. This leads to the deterioration of the flatness of the film F.

A layer formed on the film F having such a deformed shape has poor flatness and nonuniform thickness. In the manufacture of an organic EL device, a hole injection/transport layer and a light-emitting layer are formed in a region surrounded by each bank in that order. When the hole injection/transport layer is not flat, the light-emitting layer disposed on the hole injection/transport layer is not also flat. Therefore, the light-emitting layer has nonuniform light-emitting properties.

Patent Document 1 discloses a technique in which a flat layer is formed in such a manner that droplets are ejected by a droplet-ejecting process two times or more such that no recess or an uncoated portion is formed. Patent Document 2 discloses a technique in which a flat layer is formed using a leveling agent containing a silicon compound or a fluorine compound. Patent Document 3 discloses a technique in which a bank is formed on a hole injection/transport layer by patterning such that irregularities of the hole injection/transport layer have no influence.

The technique disclosed in Patent Document 1 has a problem that if the droplets ejected several times contain a single solvent, the selection of the solvent is limited because a primarily formed layer is dissolved in the solvent. The technique disclosed in Patent Document 2 has a problem that the leveling agent has influence on light-emitting properties. The technique disclosed in Patent Document 3 has a problem that if the bank is extremely high, drying occurs in various portions of droplets and therefore a formed layer has nonuniform thickness.

SUMMARY

An advantage of an aspect of the present invention is to provide a method for forming a uniform film having no deformed portions located near a bank. Furthermore, an advantage of another aspect of the present invention is to provide a method for manufacturing a device. An advantage of another aspect of the present invention is to provide a device which includes such a film and which therefore has uniform properties.

A device according to the present invention includes a bank, a film disposed in a region surrounded by the bank, and a groove extending along the periphery of the region. According to this configuration, the groove is located near the bank; hence, even if the film is formed from a liquid, end portions of the film are prevented from being raised. This allows the film to be flat. This is probably because a salute (a functional material) contained in the liquid is build up in the groove, the flow of the liquid is changed by the groove, and so on. It has been experimentally confirmed that the presence of the groove prevents the end portions of the film that are located near the bank from being raised.

In the device, the groove preferably has a ring shape and surrounds the region. This prevents the film from having a deformed portion located near the bank; hence, the film is globally flat.

In the device, the depth of the groove preferably varies depending on the distance from the bank. Raised end portions of a conventional film are formed such that the conventional film is tapered in cross section from the periphery of a region surrounded by the conventional bank to the center thereof. Therefore, if the depth of the groove is controlled to correspond to the height of the raised end portions, the film can be formed to be flat. In order to allow the film to have a U shape in cross section, a portion of the groove that corresponds to the periphery of the region surrounded by the bank is preferably deepest. In order to allow the film to have an M shape in cross section, a center portion of the film preferably is deeper than the portion of the groove D that corresponds to the periphery of the region.

The present invention provides a method for forming a film by providing a liquid containing a functional material in a region surrounded by a bank. The film-forming method includes forming a groove extending along the periphery of the region; providing the liquid in the region; and drying the liquid to form the film. The film is made of the functional material and is disposed over the groove. According to the film-forming method, the groove is located near the bank; hence, end portions of the film are prevented from being raised and therefore the film is flat. This is probably because a salute (that is, the functional material) contained in the liquid is build up in the groove, the flow of the liquid is changed by the groove, and so on. It has been experimentally confirmed that the presence of the groove prevents the end portions of the film that are located near the bank from being raised.

The term "functional material" used herein means a material having an electric or electronic function such as an electrically conducting function, an electrically insulating function, a piezoelectric function, a pyroelectric function, or a dielectric function; an optical function such as a selective light-absorbing function, a light-reflecting function, a polarizing function, a selective light-transmitting function, a nonlinear optical function, a phototropic function, or a luminescent function such as a fluorescent or phosphorescent function; a magnetic function such as a ferromagnetic function, a soft magnetic function, a nonmagnetic function, or a magnetic permeation function; a chemical function such as an adsorption function, a desorption function, a catalytic function, a water-absorbing function, an ionic conduction function, an oxidation-reduction function, an electrochemical function, or an electrochromic function; a mechanical function such as a anti-abrasion function; a thermal function such as a heat-conducting function, a heat-insulating function, or an ultraviolet radiation function; or a biological function such as a biocompatible function or an anti-thrombotic function. The term "functional material-containing liquid" used herein means a liquid from which a film (a functional film) having the above function can be formed by processing a component contained in the liquid. In order to form light-emitting layers for light-emitting devices, a functional material having such a fluorescent or phosphorescent function may be used. In order to prepare color filters, a functional material containing colored particles such as pigment particles may be used. In order to prepare transparent pixel electrodes for liquid crystal devices, a functional material containing conductive particles such as indium tin oxide (ITO) particles may be used.

In the film-forming method, the bank is preferably formed during the formation of the groove. Since an independent procedure for forming the groove is not necessary, the film can be readily formed. A conventional technique can be used to form the bank and the groove. When the bank is patterned by etching or the like, the bank and the groove can be formed together by forming a deep trench near the bank.

The film-forming method preferably further includes forming a lyophilic region having affinity to the liquid by surface-treating the bank in advance of providing the liquid in the region. In each droplet of the liquid placed on a base member, the solute is precipitated locally at the periphery of the liquid droplet. The periphery of the liquid droplet is pinned with the precipitated salute and therefore the shrinkage of the liquid droplet (the reduction of the diameter of the liquid droplet) is prevented during the drying of the liquid droplet. If the bank has no lyophilic surface region, the drying of the liquid droplet starts at various positions and therefore the film cannot be uniformly formed. With respect to FIG. 15B, the raised end portions F2 and F3 of the conventional film F that are located near the conventional bank have different thicknesses. Furthermore, the raised end portions F2 and F3 are different in thickness from a center portion F1 of the conventional film F. The drying of the liquid droplet starts at various positions in each pixel. This prevents a uniform film from being formed in the pixel. If a light-emitting device such as an organic EL device includes the pixel, display defects such as luminance variations and dark spots may be caused. However, in the film-forming method, the bank has the lyophilic region and therefore the drying of the liquid droplet is prevented from starting at various positions. Therefore, the drying of the liquid droplet starts at a position where the lyophilic region is located. This prevents a problem that a film with nonuniform thickness is formed because the drying of droplets starts at different positions in conventional methods.

The following phenomenon is hereinafter referred to as "pinning" a phenomenon that the shrinkage of the liquid droplet is prevented during the drying of the liquid droplet because of the precipitation of the solute as described above. A position where pinning occurs is hereinafter referred to as "a pinning point". In the film-forming method, the pinning point of the liquid droplet, that is, a position where the drying of the liquid droplet starts is controlled by forming the lyophilic region.

The term "lyophilicity" used herein means affinity to the liquid provided in the region surrounded by the bank. The term "lyophobicity" used herein means non-affinity to the liquid. In the film-forming method, the lyophilic region may have higher affinity to the liquid as compared to a surface region of the bank other than the lyophilic region. The surface region is preferably lyophobic and may have lower affinity to the liquid as compared to the lyophilic region. This allows the surface of the liquid placed in the region surrounded by the bank to be pinned at the position of the lyophilic region.

In the film-forming method, the bank preferably includes a lyophilic layer having affinity to the liquid and a lyophobic layer having non-affinity to the liquid and the lyophilic region is preferably a portion of the lyophilic layer that is exposed at a surface of the bank. This allows the lyophilic region to be readily formed on the bank.

In the film-forming method, the bank is preferably formed in such a manner that the lyophilic layer is formed, the lyophobic layer is formed on the lyophilic layer, the lyophobic layer is patterned, and the lyophilic layer is patterned using the resulting lyophobic layer as a mask. According to the film-forming method, a side surface of the lyophilic layer is flush with that of the lyophobic layer; hence, the film can be prevented from being nonuniformly formed due to the misalignment of the side surfaces thereof. In conventional methods for forming banks, lyophilic regions and lyophobic regions are usually formed one by one. This can cause the slight misalignment of side surfaces of the lyophilic and lyophobic regions and the misalignment thereof affects the flatness of films formed using the lyophilic and lyophobic regions. However, in the film-forming method, since the lyophilic layer is patterned using the patterned lyophobic layer as a mask, the side surface of the lyophilic layer is prevented from being misaligned with that of the lyophobic layer; hence, the film is flat and has uniform thickness. Furthermore, a resist mask for patterning the lyophilic layer need not be formed; hence, there is an advantage in that the number of forming steps is small.

In the film-forming method, the lyophilic layer has preferably substantially the same thickness as that of the film. The surface of the liquid placed on a base member is convex in the beginning of drying. With a reduction in the volume of the liquid, the liquid surface becomes concave in cross section as if the liquid surface is pulled by the inner wall of the bank. Since the liquid surface is pinned at the position of the upper surface of the lyophilic layer, a center portion of the film and an end portion thereof that is located on the periphery (the vicinity of the bank, of the region surrounded by the bank are controlled to have substantially the same thickness as that of the lyophilic layer. Therefore, according to the film-forming method, the thickness of the film can be controlled to be globally uniform and therefore the film is flat.

A method for manufacturing a device according to the present invention includes forming a film by providing a liquid in a region surrounded by a bank. The film is formed by the above film-forming method. According to the film-forming method, a portion of the film that is located near the bank can be prevented from being deformed and therefore the film is uniform; hence, the device has uniform properties.

In the device-manufacturing method, the device may include the film and an electrode underlying the film and the groove may be formed by partly removing the electrode. The electrode is preferably partly removed in such a manner that a surface portion is removed from the electrode. An advantage of the present invention can be achieved only by processing of the electrode. A reduction in the aperture ratio of the device can be prevented in such a manner that a surface portion is removed from the electrode.

In the device-manufacturing method, the device may include the film and an electrode underlying the film and the groove may be formed by partly removing the bank. When the bank is patterned by etching or the like, the bank and the groove can be formed together by forming a deep trench near the bank. According to this technique, an advantage of the present invention can be achieved only by processing the bank.

In the device-manufacturing method, the device may include the film and an electrode underlying the film and the film may be formed in such a manner that a hole injection/transport layer is formed by providing a first composition containing a material for forming the hole injection/transport layer in the region surrounded by the bank and a light-emitting layer is formed by providing a second composition containing a material for forming the light-emitting layer on the hole injection/transport layer. According to the device-manufacturing method, the hole injection/transport layer can be formed to have a flat surface; hence, the light-emitting layer formed on the flat surface of the hole injection/transport layer can be formed to be flat and uniform. The device has uniform light-emitting properties. Since the groove is located near the bank, the hole injection/transport layer, which is the lowermost one, is likely to have a thick portion located near the bank. A change in thickness does not seriously affect electrically conductive properties of the hole injection/transport layer. A portion of the film that is located near the bank is not seriously different in light-emitting properties from other portions thereof.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
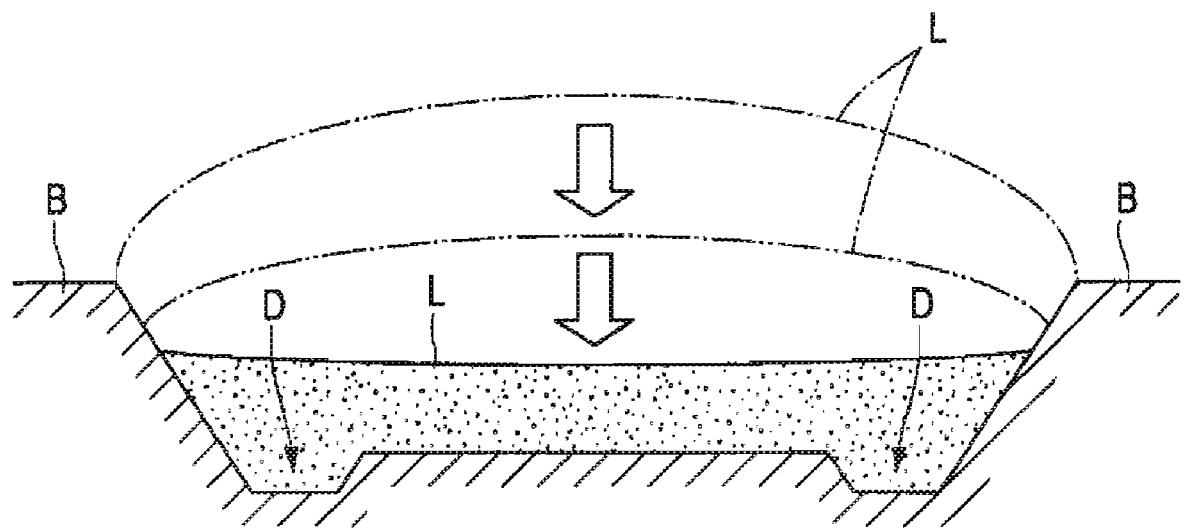
FIGS. 1A and 1B are conceptual views illustrating a film-forming method according to an embodiment of the present invention.

Embodiments of the present invention will now be described with reference to the accompanying drawings. In the drawings, in order to show layers and members on a recognizable scale, different scales are used depending on the size of the layers and members.

Figure 1B:
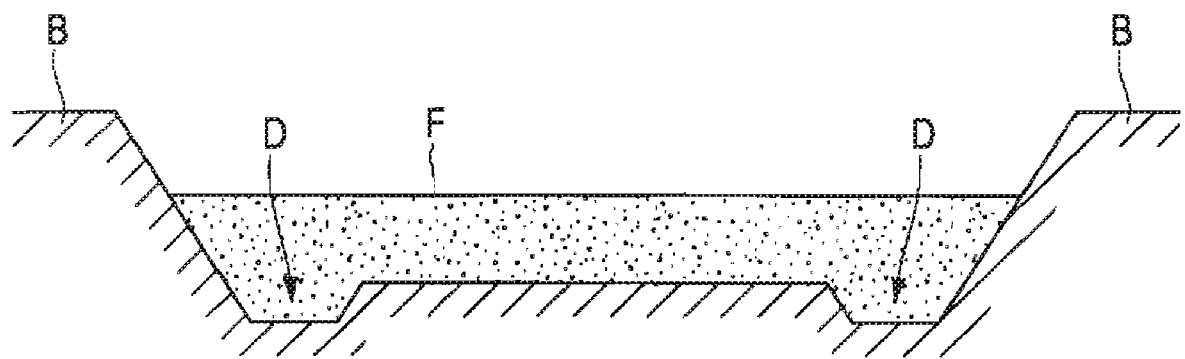

A film-forming method according to the present invention will now be described. FIGS. 1A and 1B conceptually show the film-forming method. The film-forming method is useful in forming a film F by providing a liquid L containing a functional material on a base member and includes a step of forming a groove D extending along the periphery of a region surrounded by each bank B as shown in FIG. 1A, a step of providing the liquid L in the region surrounded by the bank B as shown in FIG. 1A, and a step of drying the liquid L to form the film F a shown in FIG. 1B. The film F is made of the functional material and is disposed over the groove D. The bank B may be formed in the step of forming the groove D. The groove D prevents end portions of the film F from being raised. Therefore, the film F has excellent flatness.

The bank B is disposed on the base member and contains an inorganic compound or an organic compound such as a resin. The groove D preferably has a ring shape so as to surround the region supplied with the liquid L. The liquid L may be aqueous or organic.

The reason why the film F is flat is probably as follows: a solute, that is, the functional material transported near the bank B is build up in the groove D, the flow of the liquid L is changed by the groove D, and so on. It has been experimentally confirmed that the presence of the groove D prevents end portions of the film F that are located near the bank B from being raised. In particular, when the groove D has a depth of about 100 nm, the film end portions is raised by only about 1 nm, although end portions of conventional films are raised by about 7 nm.

Figure 2:
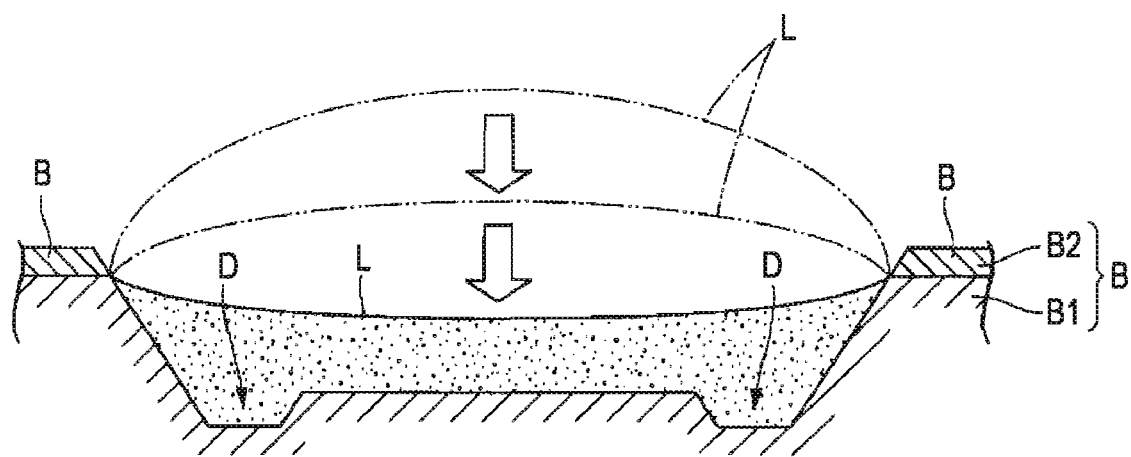
FIG. 2 is a conceptual view illustrating a film-forming method according to another embodiment of the present invention.

The bank B may have a configuration as shows in FIG. 2. With reference to FIG. 2, the bank B includes a lyophilic layer B1 having affinity to the liquid L and a lyophobic layer B2 having non-affinity to the liquid L. Since the bank B includes the lyophilic layer B1, the liquid L is dried in such a state that the surface of the liquid L is pinned at the boundary between the lyophilic layer B1 and the lyophobic layer B2. That is, since a position where the drying of the liquid L starts (the pinning point of the liquid L) is securely pinned at the boundary between the lyophilic layer B1 and the lyophobic layer B2, the following problem does not occur: a problem that the flatness and uniformity of the film F are deteriorated, as caused by a conventional technique.

A side surface of the lyophilic layer B1 is preferably flush with that of the lyophobic layer B2. The lyophilic layer B1 preferably has a thickness substantially equal to that of the film F. The banks B can be formed by, for example, a process including a step of forming the lyophilic layers B1, a step of forming the lyophobic layers B2 on the lyophilic layers B1, a step of patterning the lyophobic layers B2, and a step of patterning the lyophilic layers B1 using the resulting lyophobic layers B2 as masks.

If the lyophilic layers B1 and the lyophobic layers B2 are formed by a conventional process one by one, the lyophilic layers B1 are slightly misaligned with the lyophobic layer B2. This affects the flatness of the film F. However, according to that process, the lyophilic layers B1 are prevented from being misaligned with the lyophobic layer B2 because the lyophilic layers B1 are patterned using the resulting lyophobic layers B2 as masks; hence, the film F is flat and has uniform thickness. That process is simple because any resist mask need not be formed to pattern the lyophilic layers B1. If the thickness of the lyophilic layers B1 is set to be substantially equal to that of the film F, the thickness of end portions of the film F and the thickness of a center portion thereof can be controlled to be substantially equal to the thickness of the lyophilic layers B1. This allows the film F to have uniform thickness and to be flat.

Figure 3:
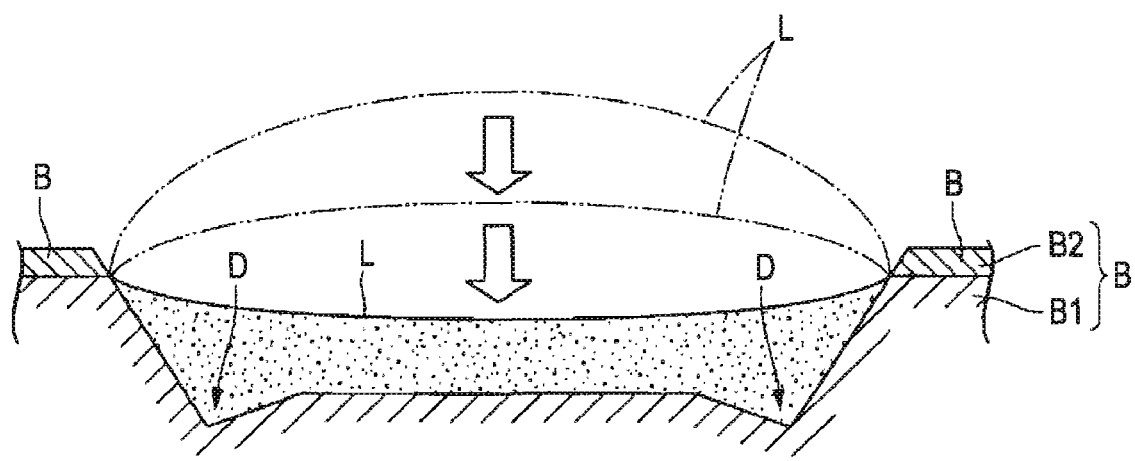
FIG. 3 is a conceptual view illustrating a film-forming method according to another embodiment of the present invention.
Figure 15A:
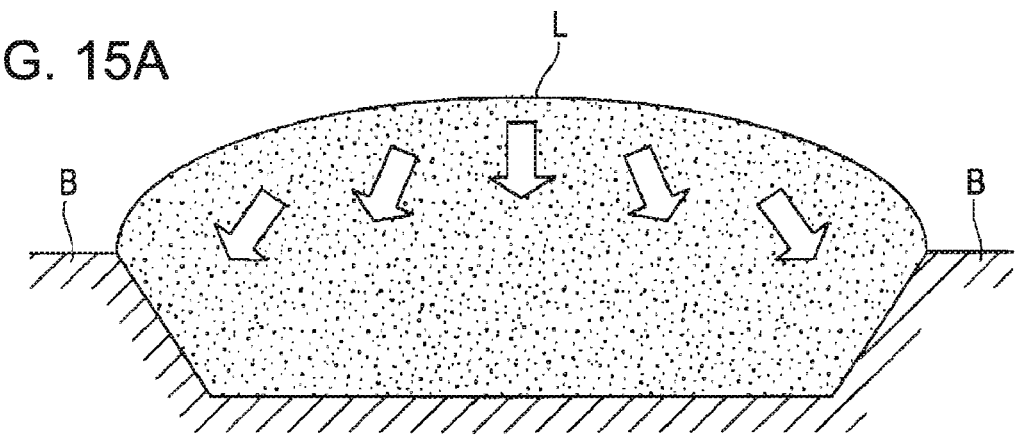
FIGS. 15A and 15B are conceptual views illustrating a know film-forming method.
Figure 15B:
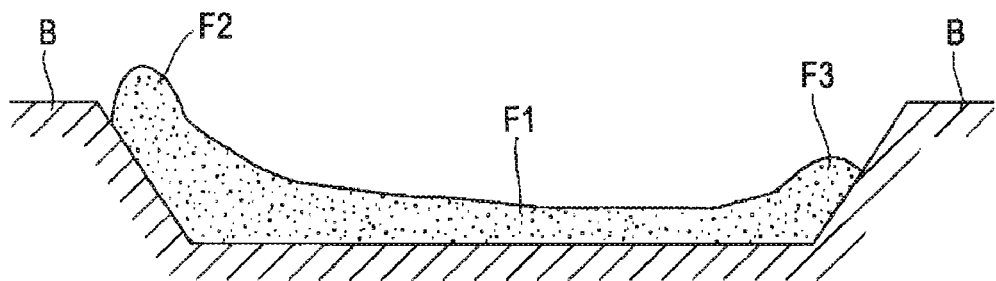

The groove D may have a configuration as shown in FIG. 3. With reference to FIG. 3, the depth of the groove D varies depending on the distance from the bank B surrounding the groove D. With reference to FIG. 15B, the raised end portions F2 and F3 are formed such that the conventional film F is tapered in cross section from the periphery of the region surrounded by the conventional bank B to the center thereof. Therefore, if the depth of the groove D is controlled to correspond to the height of the raised end portions F2 and F3, the film F can be formed to be flat. In order to allow the film F to have a U shape in cross section, a portion of the groove D that corresponds to the periphery of the region surrounded by the bank B is preferably deepest. In order to allow the film F to have an M shape in cross section, a center portion of the film F preferably is deeper than the portion of the groove D that corresponds to the periphery of the region.

Examples of a process for providing the liquid L in the region surrounded by the bank B include a droplet-ejecting process (so-called an ink jet process), a dispensing process, a spin-coating process, and similar processes. In particular, the droplet-ejecting process has advantages that the loss of a material used is small and a desired amount of the material can be precisely provided at a desired position.

Examples of the droplet-ejecting process include a charge control process, a pressure vibration process, an electromechanical conversion process, an electrothermal conversion process, and an electrostatic attraction process. The charge control process is as follows: a liquid material is electrically charged with a charge electrode and then ejected from a nozzle in such a manner that the flight direction of the charged liquid material is controlled with a deflection electrode. The pressure vibration process is as follows: an ultra-high pressure is applied to a liquid material such that the liquid material is ejected from the tip of a nozzle. In the pressure vibration process, if no control voltage is applied to the liquid material, the liquid material is straightly ejected from the nozzle; however, if a control voltage is applied to the liquid material, electrostatic repulsion occurs in the resulting material and therefore the liquid material is scattered and is not ejected from the nozzle. The electrothermal conversion process is so-called a piezoelectric process and is as follows: a piezoelectric element is deformed with a pulsed electric signal and a pressure is applied to a space containing a liquid material through a flexible member by means of the deformation of the piezoelectric element such that the liquid material is forced out of the space and then ejected from a nozzle. The electrothermal conversion process is as follows: a liquid material is rapidly vaporized with a heater placed in a space containing the liquid material, bubbles are thereby generated, and the liquid material in the space is ejected from a nozzle by means of the pressure of the bubbles. The electrostatic attraction process is as follows: a very small pressure is applied to a space containing a liquid material, a meniscus of the liquid material is thereby formed in a nozzle, and an electrostatic charge is then applied to the liquid material such that the liquid material is ejected from the nozzle. In addition, the following techniques can be used: a technique for varying the viscosity of a fluid by applying an electric field to the fluid, a technique for ejecting a fluid using an electric discharge spark, and the like.

Figure 4:
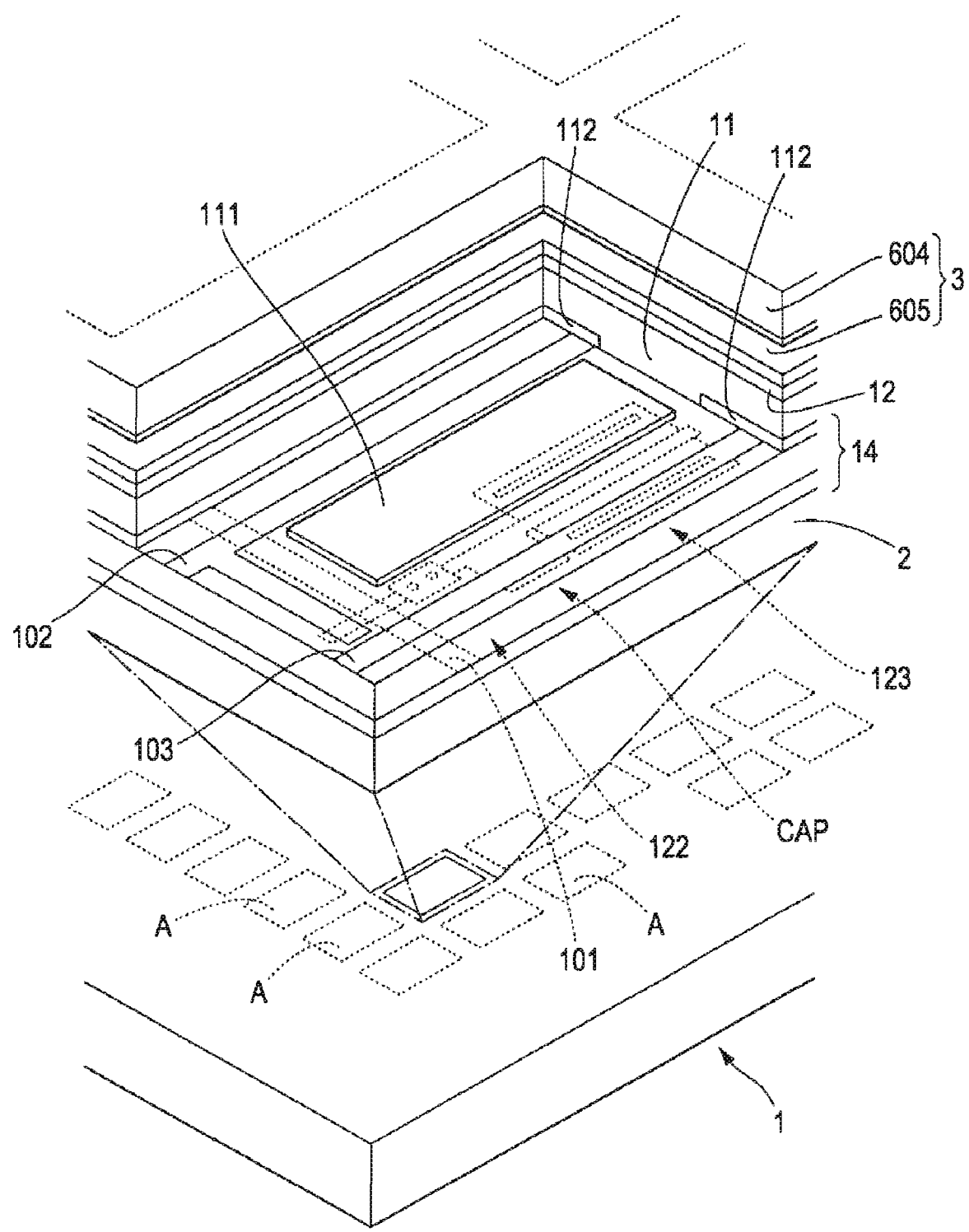
FIG. 4 is a schematic perspective view of a display device that is an example of a device according to the present invention.

A device according to the present invention will now be described. FIG. 4 shows an active matrix-type display device 1 (an organic EL device) in perspective view. The display device 1 is an example of the device according to the present invention. The display device 1 includes organic EL diodes prepared by the film-forming method according to the present invention. The display device is driven by an active matrix of thin-film transistors.

The display device 1 includes a base member 2, a circuit element section 14 including the thin-film transistors that are circuit elements, pixel electrodes 111 that are anodes, light-emitting sections 11 including light-emitting layers, and a counter electrode 12 that is a cathode, and sealing sections 3, these components being arranged above the base member 2.

The base member 2 includes, for example, a glass substrate. Examples of a substrate used herein include various know substrates, such as silicon substrates, quartz substrates, ceramic substrates, metal substrates, plastic substrates, and plastic film substrates, used for electro-optical devices or circuit boards in addition to the glass substrate.

A plurality of pixel regions A serving as light-emitting regions are arranged on the base member 2 in a matrix pattern. For color display applications, the pixel regions A are arranged in a predetermined array so as to each correspond to red, green, or blue. The pixel regions A each have one of the pixel electrodes 111. The following lines are located near the pixel electrodes 111: signal lines 102, scanning lines 103, and a common power supply line 101. The pixel regions A have a rectangular shape in plan view as shown in FIG. 4 and may have an arbitrary shape such as a circular shape or an elliptical shape.

The sealing sections 3 block moisture and oxygen to protect the counter electrode 12 and light-emitting sections 11 from being oxidized and include a sealing resin applied to the base member 2 and portions of a sealing substrate (or a sealing can) 604 bonded to the base member 2. Examples of the sealing resin include thermosetting resins and ultraviolet-curable resins. In particular, an epoxy resin, which is a kind of thermosetting resin, is preferably used. The sealing substrate 604 is made of glass or metal. The base member 2 and the sealing substrate 604 are bonded together with a sealant. A desiccant is placed in the base member 2. An inert gas-containing layer 605 containing an inert gas is disposed in a space present between the base member 2 and the sealing substrate 604.

The pixel regions A include first thin-film transistors 122, supplying scanning signals to gate electrodes through the scanning lines 101, for switching; storage capacitors cap for storing image signals supplied from the first thin-film transistors 122 through the signal lines 102; second thin-film transistors 123, supplying the image signals stored in the storage capacitors cap to the gate electrodes, for driving; the pixel electrodes 111 which are supplied with driving currents from the common power supply line 103 when the pixel electrodes 111 are electrically connected to the common power supply line 103; and the light-emitting sections 11 sandwiched between the pixel electrodes 111 and the counter electrode 12. The light-emitting sections 11 each include a functional layer, serving as a light-emitting layer, including an organic EL sublayer. Each pixel electrode 111, each light-emitting section 11, and a portion of the counter electrode 12 form an organic EL element 10.

In the pixel regions A, when the first thin-film transistors 122 are turned on by driving the scanning lines 101, the voltages of the signal lines 102 are stored in the storage capacitors cap. The second thin-film transistors 123 are turned on or off depending on the state of the storage capacitors cap. Currents are supplied from the common power supply line 103 to the pixel electrodes 111 through the channels of the second thin-film transistors 123 to flow into the counter electrode 12 through the light-emitting sections 11. The supply of the currents allows the light-emitting sections 11 to emit light.

In the display device 1, light emitted from the light-emitting sections 11 toward the base member 2 passes through the circuit element section 14 and the base member 2 to travel toward the lower side of the base member 2 (the side close to an observer) and light emitted from the light-emitting sections 11 on the side opposite to the base member 2 is reflected by the counter electrode 12 and passes through the circuit element section 14 and the base member 2 to travel toward the lower side of the base member 2. That is, the display device 1 is a bottom emission type. The display device 1 may be configured to be a top emission type in such a manner that the counter electrode 12 is formed from a transparent material such that light emitted from the light-emitting sections 11 passes through the counter electrode 12. Examples of such a transparent material include ITO, platinum (Pt), iridium (Ir), nickel (Ni), and palladium (Pd).

Figure 5A:
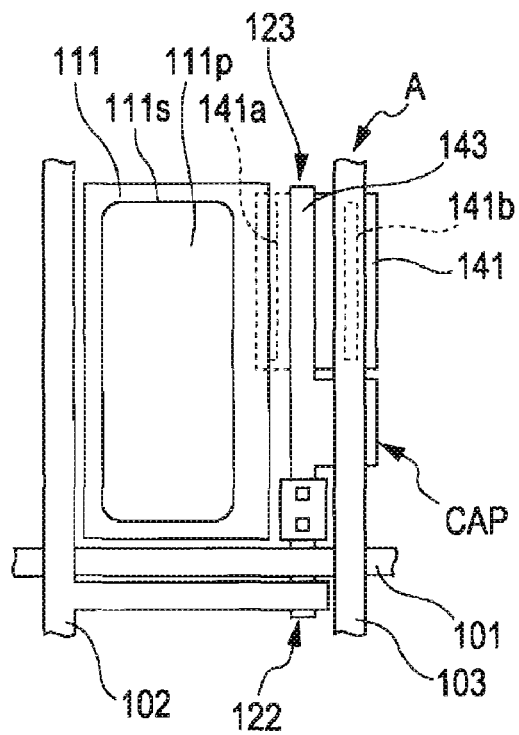
FIG. 5A is a plan view of a pixel-driving portion disposed in a pixel region disposed in the display device and FIG. 5B shows a bank separating pixels disposed in the display device.
Figure 5B:
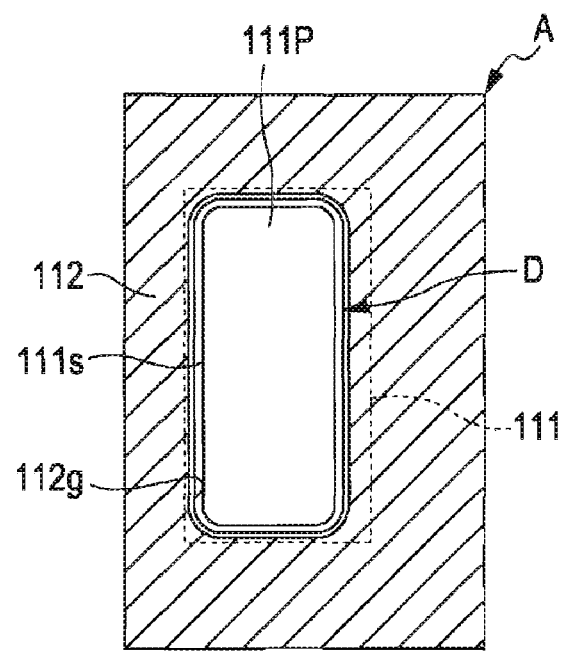

FIGS. 5A and 5B show one of the pixel regions A disposed in the display device 1 in plan view. In particular, FIG. 5A shows a pixel-driving portion, disposed in each pixel region A, including TFTs and FIG. 5B shows each bank 112 separating pixels. With reference to FIGS. 5A and 5B, the pixel electrode 111 disposed in the pixel region A has a rectangular shape in plan view and surrounded by one of the signal lines 102, the common power supply line 103, and one of the scanning lines 101. The pixel region A is surrounded by the bank 112. The bank 112 has a primary opening 112g which correspond to the pixel electrode 11 and which has substantially a rectangular shape in plan view. The organic EL elements 10 are each disposed in the corresponding primary opening 112g.

The pixel electrode 111 has a step 111s formed by partly removing the pixel electrode 111 and also has a protruding portion 111p located in a center region of the pixel electrode 111. The step 111s extends along the four sides of the pixel electrode 111 to surround the protruding portion 111p. A space is located between the bank 112 and the protruding portion 111p. The space therebetween and the step 111s define a circular groove D located near the bank 112.

Figure 6:
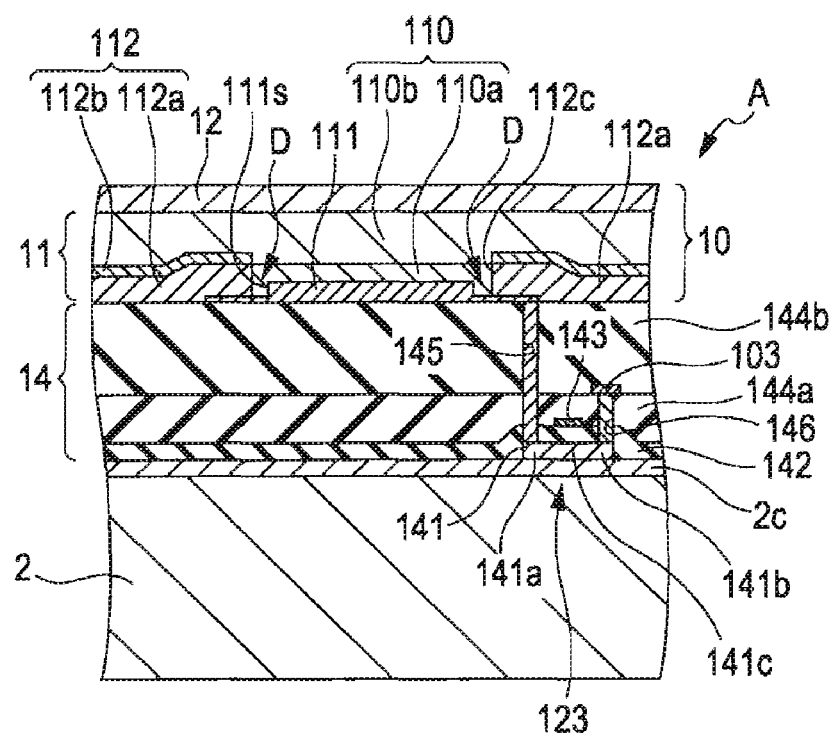
FIG. 6 is an enlarged sectional view of the pixel region.

FIG. 6 shows the pixel region A in cross section in an enlarged manner. With reference to FIG. 6, a base protection layer 2c made of silicon dioxide is disposed on the base member 2 and dotted semiconductor layers 141 made of polycrystalline silicon are arranged on the base protection layer 2c. The semiconductor layers 141 each have a source region 141-b and a drain region 141a that are heavily doped with phosphorus (P) ions and also each have a channel region 141c doped with no P ions. A transparent gate insulating layer 142 extends over the base protection layer 2c and the semiconductor layers 141. Gate electrodes 143 (scanning lines) made of aluminum (Al), molybdenum (Mo), tantalum (Ta), titanium (Ti), or tungsten (W) are arranged on the gate insulating layer 142. A transparent first interlayer insulating layer 144a and a transparent second Interlayer insulating layer 144b are arranged on the gate electrodes 143 and the gate insulating layer 142 in that order. The gate electrodes 143 are located at positions corresponding to the channel regions 141c. First contact holes 145 and second contact holes 146 extend through the first and second interlayer insulating layers 144a and 144b to the drain regions 141a and the source regions 141b, respectively. The circuit element section 14 corresponds to a zone ranging from the base protection layer 2c to the second interlayer insulating layer 144b.

The pixel, electrodes 11 are made of ITO or the like and are arranged on the second interlayer insulating layer 144b. The first contact holes 145 are each connected to the corresponding pixel electrode 111. The second contact holes 146 are connected to the common power supply line 103. The second thin-film transistors 123 are arranged in the circuit element section 14 and are each connected to the corresponding pixel electrode 111. The storage capacitors cap and the first thin-film transistors 122, which are not shown in FIG. 6, are also arranged in the circuit element section 14.

The light-emitting sections 11 each include a functional layer 110 and the corresponding bank 112. The functional layers 110 are each disposed on the corresponding pixel electrode 111. The banks 112 are disposed between the second interlayer insulating layer 114b and the counter electrode 12 and each surround the corresponding functional layer 110. The functional layers 110 are overlaid with the counter electrode 12. The organic EL elements 10 serve as light-emitting elements and each include the corresponding light-emitting section 11, the corresponding light-emitting section 11, and a portion of the counter electrode 12. The pixel electrodes 111, which are made of ITO or the like and have substantially a rectangular shape in plan view, preferably have a thickness of 50 to 200 nm and more preferably about 150 nm. The steps 111s, which each extend along the periphery of the corresponding pixel electrode 111, preferably have a height of 2 to 100 nm and more preferably 5 to 50 nm. She banks 112 are each disposed between the pixel electrodes 111.

The banks 112 each include a first bank layer 112a and a second bank layer 112b that are arranged above the base member 2 in that order. The first bank layers 112a hang over the peripheries of the pixel electrodes 111. That is, the periphery of each pixel electrode 111 overlaps with that of each first bank layer 112a in plan view. The first bank layers 112a are each overlaid with the corresponding second bank layer 112b.

The first and second bank layers 112a and 112b each have a first opening and a second opening, respectively. The first and second openings are connected to each other to form the primary opening 112g. The first and second openings are aligned with each other.

The first bank layers 112a are made of, for example, an inorganic material such as silicon dioxide and preferably have a thickness (height) of about 50 to 200 nm. The second bank layers 112b are made of, for example, an organic material, such as an acrylic resin, an epoxy resin, or a silane-coupling agent, having heat resistance and solvent resistance and preferably have a thickness (height) of about 1 to 10 nm. The heights of the first and second bank layers 112a and 112b are for exemplification and should not in any way be construed as limitative.

The number of layers disposed in each bank 112 is not limited to two. The bank 112 may include a single organic or inorganic layer. The organic layer is made of an organic material, such as an acrylic resin or a polyimide resin, having high heat resistance. The inorganic layer is made of an inorganic material such as polysilazane or polysiloxane. An organic-inorganic hybrid material containing polysiloxane may be used to form the bank 112.

The first bank layers 112a have lyophilic surface regions. The second bank layers 112b have lyophobic surface regions. The lyophobic surface regions are formed by plasma-treating the second bank layers 112b using a treatment gas such as tetrafluoromethane or carbon tetrafluoride. When the second bank layers 112b are made of a silane-coupling agent such as trimethoxysilane, the wettability (lyophobicity) of the lyophobic surface regions can be controlled by selecting a terminal function group of the silane-coupling agent.

The functional layers 110 each include a hole injection/transport sublayer 110a disposed on the corresponding pixel electrode 111 and a portion of a light-emitting layer 110b adjacent to the hole injection/transport sublayer 110a. The functional layers 110 may each further include another functional sublayer, such as an electron transport layer, adjacent to the light-emitting layer 110b.

The hole injection/transport sublayer 110a has a function of injecting holes into the light-emitting layer 110b and a function of transporting holes in the hole injection/transport sublayers 110a. The hole injection/transport sublayer 11a is disposed between the pixel electrode 111 and the light-emitting layer 110b; hence, the light-emitting layer 110b has high light-emitting efficiency, long life, and other good properties. The light-emitting layer 110b emits light when holes injected from the hole injection/transport sublayer 110a into the light-emitting layer 110b are recombined with electrons injected from the counter electrode 12 into the light-emitting layer 110b.

The light-emitting layer 110b contains a red luminescent material capable of emitting red light, a green luminescent material capable of emitting green light, and a blue luminescent material capable of emitting blue light so as to be capable of emit white light. The light-emitting layer 110b extends over the pixel regions A and is shared by the pixels. The white light emitted from the light-emitting layer 110b passes through color filters, which are not shown. This separates the white light into color light components to allow a color image to be displayed.

The hole injection/transport sublayers 110a can be formed from a mixture of polystyrenesulfonic acid and a polythiophene derivative such as polyethylene dioxythiophene. A material for forming the hole injection/transport sublayers 110a is not limited to the mixture. Examples of such a material for forming the hole injection/transport sublayers 110a include various known substances such as pyrazoline derivatives, aryl amine derivatives, stilbene derivatives, and triphenyl diamine derivatives; copper phthalocyanine (CuPc); polytetrahydrothiophenylphenylene; polyphenylenevinylene; 1,1-bis-(4-N,N-ditolylaminophenyl) cyclohexane; and tris(8-hydroxyquinolinol) aluminum.

Examples of such a material for forming the light-emitting layer 110b include polyparaphenylene vinylene derivatives, polyphenylene derivatives, polyfluorene derivatives, polyvinylcarbazole derivatives, polythiophene derivatives, perylene dyes, coumarin dyes, and rhodamine dyes. These polymers may be doped with rubrene, perylene, 9,10-diphenylanthracene, tetraphenylbutadiene, Nile red, coumarin-6, or quinacridone.

The upper surface of each hole injection/transport sublayer 110a is flush with the interface between each first bank layer 112a and each second bank layer 112b. The first bank layer 112a has a thickness substantially equal to that of the hole injection/transport sublayer 110a. The upper surface of the first bank layer 112a and the upper surface of the hole injection/transport sublayer 110a are connected to each other to form a flat plane. The light-emitting layer 110b extends over the second bank layers 112b and the hole injection/transport sublayers 110a. The light-emitting layer 110b can be formed by a spin-coating process or the like and the upper surface thereof is flat.

The counter electrode 12 extends over the light-emitting sections 11 and supplies currents to the functional layers 110 in cooperation with the pixel electrodes 111. The counter electrode 12 includes, for example, a calcium layer and an aluminum layer.

A smaller work function layer is preferably located close to the light-emitting layer 110b. That is, the calcium layer is in direct contact with the light-emitting layer 110b to inject electrons into the light-emitting layer 110b.

The aluminum layer disposed in the counter electrode 12 reflects light emitted from the light-emitting layer 110b toward the base member 2. The counter electrode 12 may include a silver layer, a layer including an aluminum sublayer and a silver sublayer, or the like instead of the aluminum layer. The aluminum layer preferably has a thickness of 100 to 1,000 nm and more preferably about 200 nm. The counter electrode 12 may further include a protective layer for preventing oxidation, the protective layer being made of silicon dioxide, silicon nitride, or the like and being located on the aluminum layer.

Figure 7A:
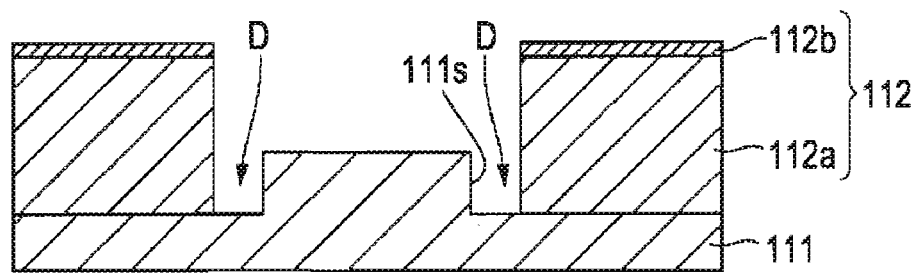
FIGS. 7A to 7D are illustrations of the configurations of grooves located near banks.
Figure 7B:
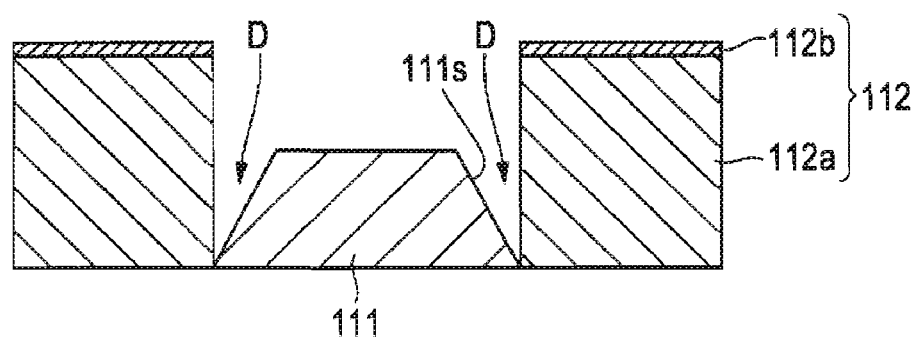
Figure 7C:
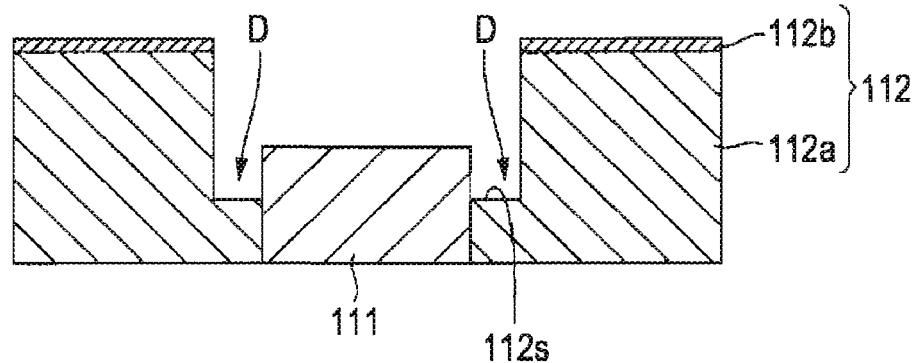
Figure 7D:
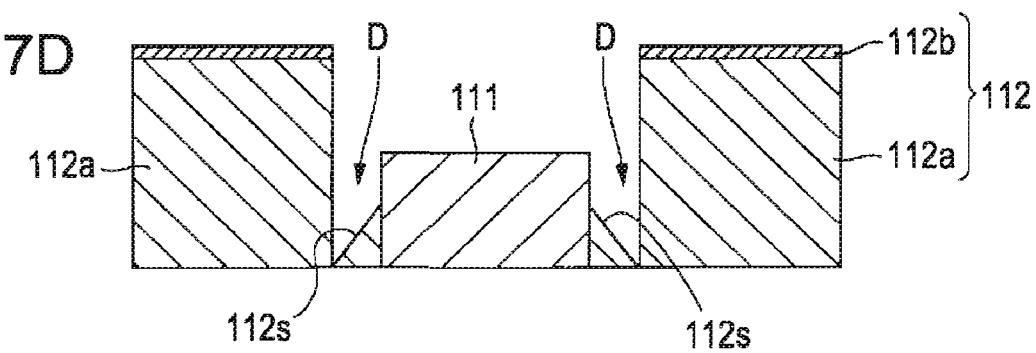

In this embodiment, the grooves D, which are located near the banks 112, are shaped to have a constant depth. The grooves D are not limited to such a configuration and may have any one of configurations shown in FIGS. 7A to 7D. As shown in FIG. 7A, the steps 111s may extend vertically from the pixel electrodes 111 such that the grooves D have a constant depth. As shown in FIG. 7B, the steps 111s may be tapered toward the peripheries of the pixel electrodes 111 and therefore the depth of the grooves D varies depending on the distance from the banks 112. As shown in FIG. 7C, the pixel electrodes 111 need not have the steps 111s but the banks 112 may have steps 112s such that the grooves D extend along the peripheries of the pixel electrodes 111. In this configuration, the steps 112s, that is, the grooves D, can be formed in such a manner that portions surrounding the pixel electrodes 111 are partly removed from the banks 112. As shown in FIG. 7D, the banks 112 may have tapered steps 112s and therefore the depth of the grooves D varies depending on the distance from the banks 112. When the grooves D have the configuration shown in FIG. 7C or 7D, the grooves D and the banks 112 may be formed in the same step. This reduces the number of manufacturing steps.

A method for manufacturing the device according to the present invention will now be described using the display device 1. The following steps are primarily described below: (1) Step of forming banks, (2) Step of forming hole injection/transport sublayers, (3 Step of forming light-emitting layer, and (4) Step of forming counter electrode.

(1) Step of Forming Banks

Figure 8:
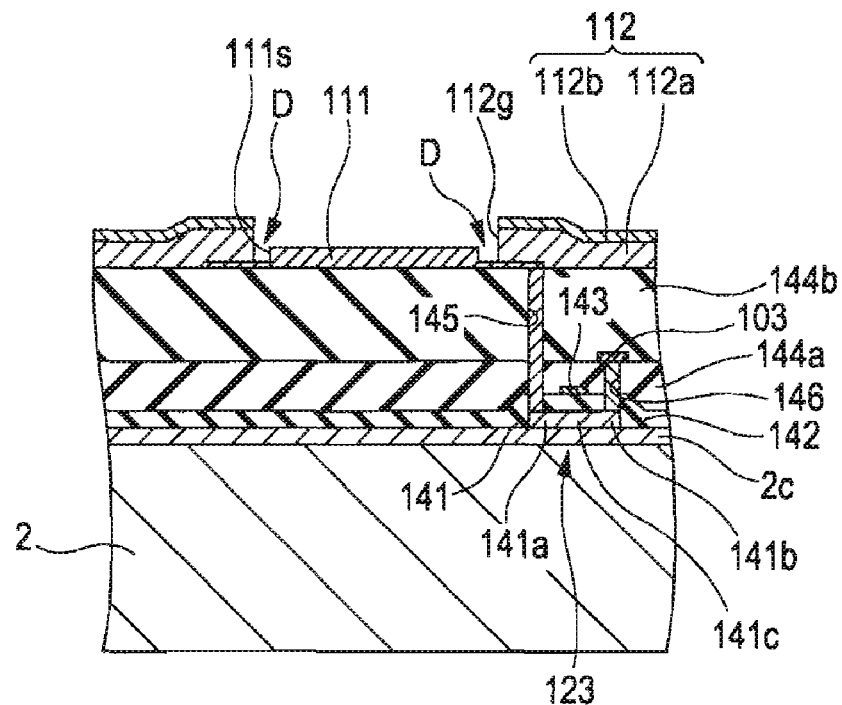
FIG. 8 is an illustration showing a step of a method for manufacturing the display device.

As shown in FIG. 8, the circuit element section 14 and the pixel electrodes 111 are formed above the base member 2 by a knoll process. The banks 112, which include the first and second bank layers 112a and 112b, are formed on the circuit element section 14. The steps 111s are formed by etching the peripheries of the pixel electrodes 111. In this operation, surface regions of the pixel electrodes 111 are etched such that the pixel electrodes 111 are not perforated. This prevents a reduction in aperture ratio. The banks 112 are spaced from the steps 111s; hence, the grooves D are defined by the banks 112 and the steps 111s.

The first bank layers 112a are formed so as to have affinity to liquid materials each used to form the hole injection/transport sublayers 110a or the light-emitting layer 110b and therefore are lyophilic. The second bank layers 112b are formed so as to having non-affinity to such liquid materials and therefore are lyophobic. The first bank layers 112a may be surface-treated to be lyophilic and the second bank layers 112b may be surface-treated to be lyophobic as required.

The first and second openings are formed in the first and second bank layers 112a and 112b, respectively so as to be connected to each other. When first bank layers 112a are aligned with the second bank layers 112b. The first and second bank layers 112a and 112b may be patterned one by one. Alternatively, the first and second bank layers 112a and 112b are formed and then patterned in one shot by dry etching using a mask disposed on the second bank layers 112b.

(2) Step of Forming Hole Injection/Transport Sublayers

Figure 9:
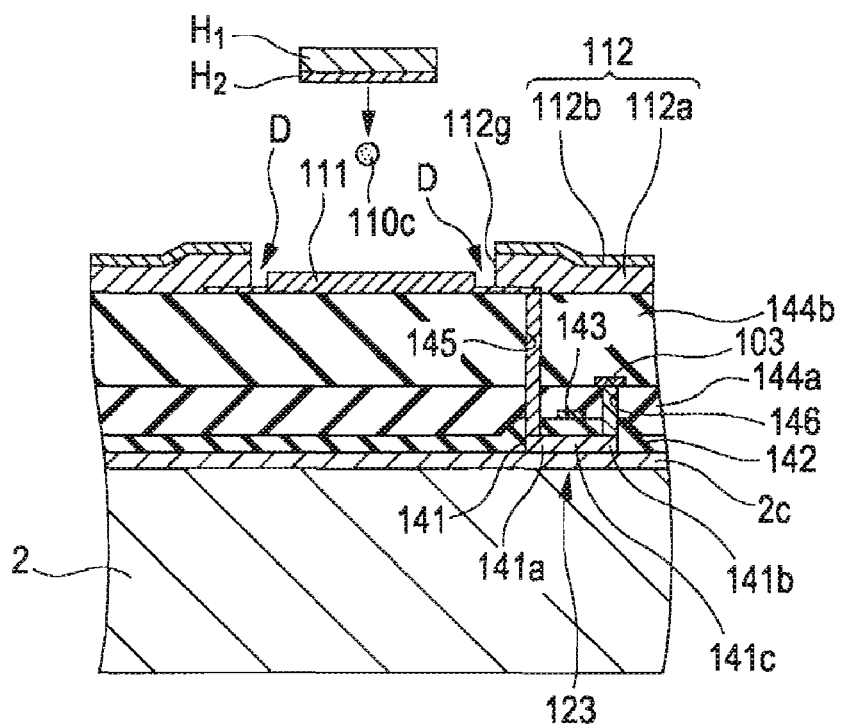
FIG. 9 is an illustration showing another step of the display device-manufacturing method.

As shown in FIG. 9, a first composition 110c that is one of the liquids is applied onto each pixel electrode 111 by a droplet-ejecting process, or an ink jet process. The first composition 110c contains the hole injection/transport sublayer-forming material. The first composition 110c is ejected from an ejection nozzle H2 attached to an ink jet head H1 in such a manner that the ejection nozzle H2 is directed to the primary opening 112g of each bank 112 and the ink jet head H1 and the base member 2 are moved relatively to each other.

The first composition 110c may contain a polar solvent and the hole injection/transport sublayer-forming material dissolved in the polar solvent. Examples of the polar solvent include isopropyl alcohol (IPA), normal butanol, γ-butyrolactone, N-methylpyrrolidone (NMP), 1,3-dimethyl-2-imidazolidine (DMI), derivatives of these compounds, and glycol ethers such as carbitol acetate and butyl carbitol acetate. The first composition 110c is not limited to these examples.

The amount of the first composition 110c ejected from the ejection nozzle H2 depends on the size of the primary opening 112g of the bank 112, the thickness of each hole injection/transport sublayer 110a, the concentration of the hole injection/transport sublayer-forming material in the first composition 110c, and/or the like. The first composition 110c may be provided in each primary opening 112g once or several times. Alternatively, an equal amount of the first composition 110c may be ejected therefrom several times or the amount of the first composition 110c ejected may be varied for each time. The first composition 110c may be ejected from the ejection nozzle H2 fixed at a predetermined position several times or may be ejected therefrom in such a manner that the position of the ejection nozzle H2 is shifted for each time.

Droplets of the first composition 110c spread on the upper surface of each pixel electrode 111 surface-treated to be lyophilic. This allows the primary opening 112g located on the pixel electrode 111 to be filled with the first composition 110c. The upper surface 112f of the bank 112 is treated to be lyophobic in advance; hence, even if droplets of the first composition 110c are provided on portions of the upper surface 112f that are located outside a target position, the first composition droplets are repelled by the upper surface 112f and therefore move into the primary opening 112g of the bank B.

Figure 10:
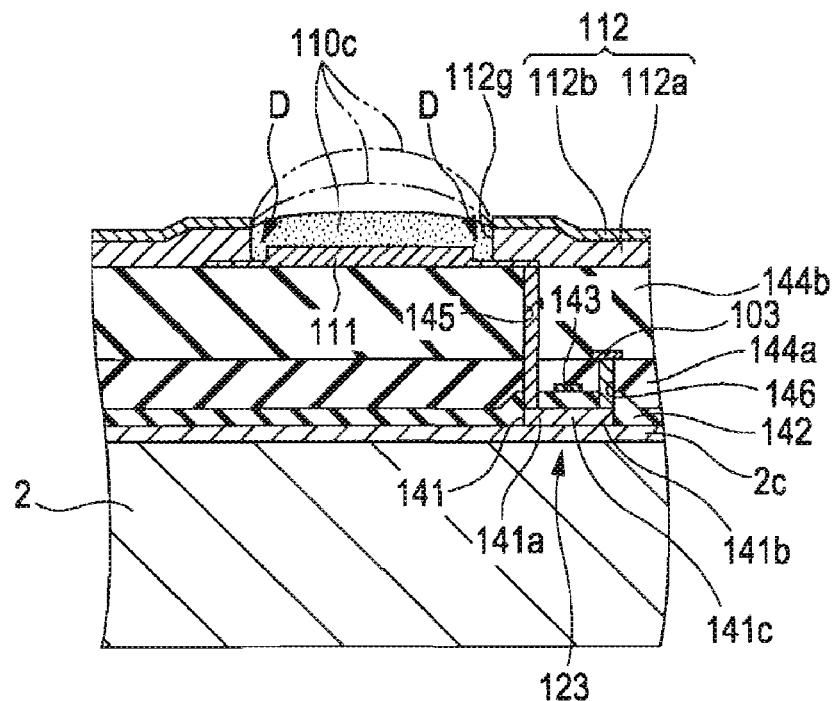
FIG. 10 is an illustration showing another step of the display device-manufacturing method.

As shown in FIG. 10, the first composition 110c placed on the pixel electrodes 111 is dried, whereby the hole injection/transport sublayers 110a are formed on the pixel electrodes 111. The step of forming the hole injection/transport sublayers 110a and steps subsequent thereto are preferably performed in an atmosphere containing no moisture or oxygen, for example, in an inert atmosphere such as a nitrogen atmosphere or an argon atmosphere.

As shown in FIG. 10, the surface of the first composition 110c placed in the primary opening 112g is lowered during the drying of the first composition 110c. This allows a solute in the first composition 110c, that is, the hole injection/transport sublayer-forming material to precipitate to form the hole injection/transport sublayer 110a in the primary opening 112g. Since a portion of the first bank layer 112a, which is lyophilic, is exposed from a side surface of the bank 112, the surface of the first composition 110c is pinned at the interface between the first bank layer 112a and the second bank layer 112b which is lyophobic. A portion of the first composition 110c that is in contact with the interface therebetween is first dried and therefore the solute is uniformly deposited in the primary opening 112g. Since the thickness of the first bank layer 112a is set to be substantially equal to that of the hole injection/transport sublayer 110a, the thickness of an end portion and that of a center portion of the hole injection/transport sublayer 110a can be controlled to be substantially equal to the thickness of first bank layer 1112a, the end portion thereof being located near the periphery of the region surrounded by the bank 112.

Figure 11:
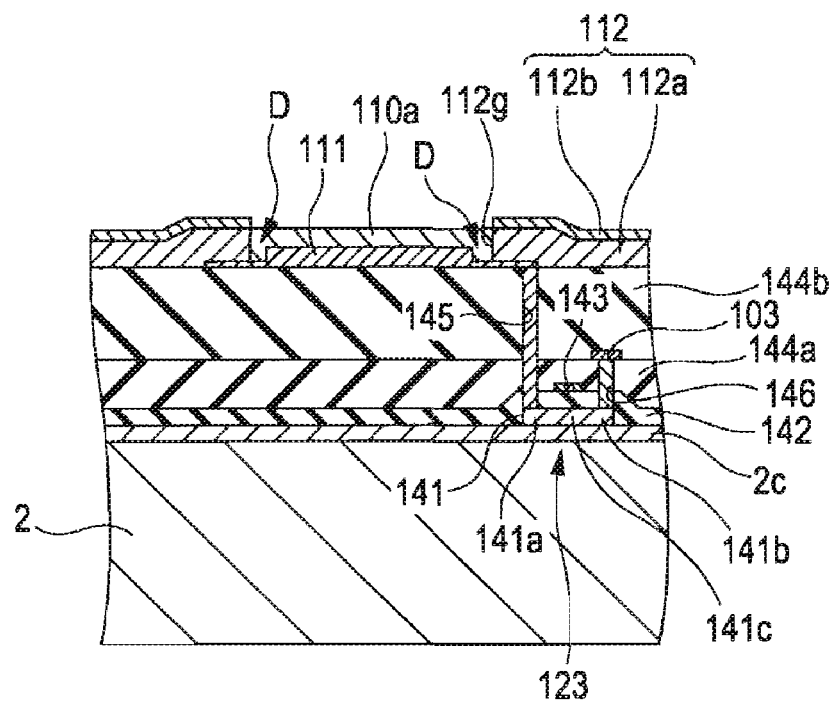
FIG. 11 is an illustration showing another step of the display device-manufacturing method.

FIG. 11 shows the hole injection/transport sublayer 110a. With reference to FIG. 11, the thickness of the hole injection/transport sublayer 110a is uniform over the primary opening 112g. Since the first bank layer 112a has substantially the same thickness as that of the hole injection/transport sublayer 110a, the upper surface of the first bank layer 112a and that of the hole injection/transport sublayer 110a are connected to each other to form a flat plane.

(3) Step of Forming Light-Emitting Layer

Figure 12:
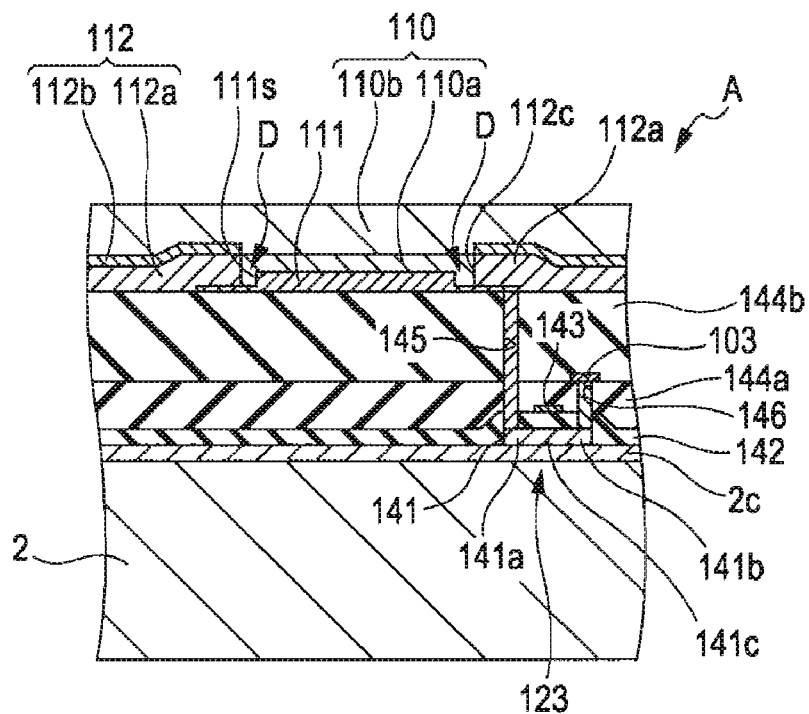
FIG. 12 is an illustration showing another step of the display device-manufacturing method.

As shown in FIG. 12, a second composition which is the other of the liquids and which contains the light-emitting layer-forming material is applied over the hole injection/transport sublayers 110a by a spin-coating process and then dried, whereby the light-emitting layer 110b is formed. The second composition further contains a non-polar solvent capable of dissolving the light-emitting layer-forming material. Examples of the non-polar solvent include cyclohexylbenzene, dihydrobenzofuran, trimethylbenzene, and tetramethylbenzene. The following process may be used to coat the hole injection/transport sublayer 110a with the second composition instead of the spin-coating process: a dip-coating process, a nozzle-coating process, or a blade-coating process.

Since the light-emitting layer 110b is formed by the spin-coating process or the like, the upper surface thereof is flat. The upper surface of each hole injection/transport sublayer 110a is also flat; hence, a portion of the light-emitting layer 110b that is located above each pixel electrode 111 has uniform thickness.

(4) Step of Forming Counter Electrode

Figure 13:
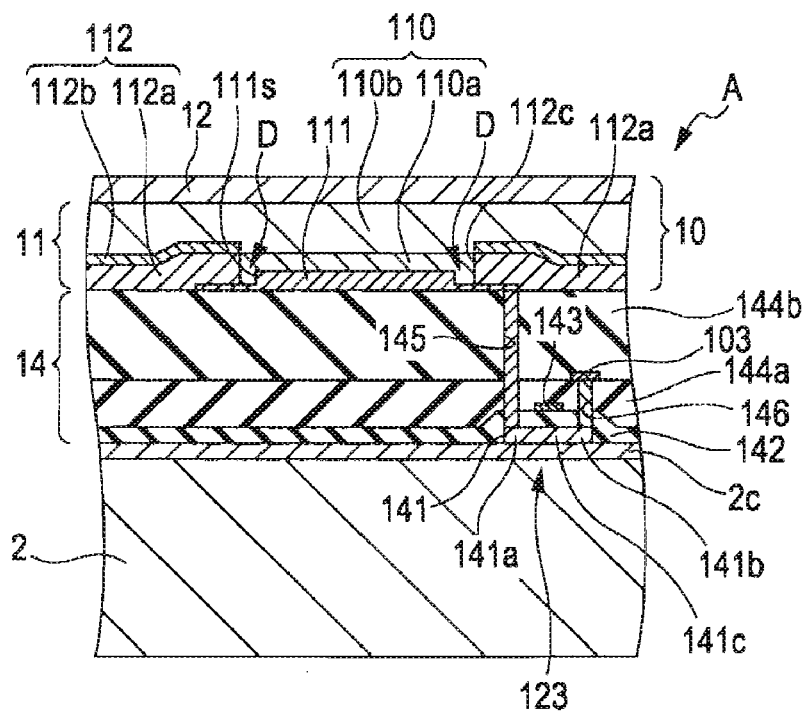
FIG. 13 is an illustration showing another step of the display device-manufacturing method.

As shown in FIG. 13, the counter electrode 12 is formed over the light-emitting layer 110b. The counter electrode 12 may include a plurality of material layers. The counter electrode 12 may include, for example, a calcium or barium layer having a small work function and the calcium or barium layer is preferably located close to the light-emitting layer 110b. The counter electrode 12 may further include a thin lithium fluoride layer depending on a material for forming a layer overlying the lithium fluoride layer. The counter electrode 12 may further include, for example, an aluminum layer having a work function greater than that of a layer underlying the aluminum layer. In order to prevent the oxidation of the counter electrode 12, a protective layer made of silicon dioxide, silicon nitride, or the like may be provided on the counter electrode 12.

Through the above steps, the light-emitting sections 11 and the organic EL elements 10 are formed above the base member 2. The base member 2 having the organic EL elements 10 is sealed. Wires attached to the base member 2 are connected to the counter electrode 12 and wires connected to the circuit element section 14 are connected to a driving integrated circuit (IC) located above or outside the base member 2, whereby the display device 1 is obtained.

Figure 14:
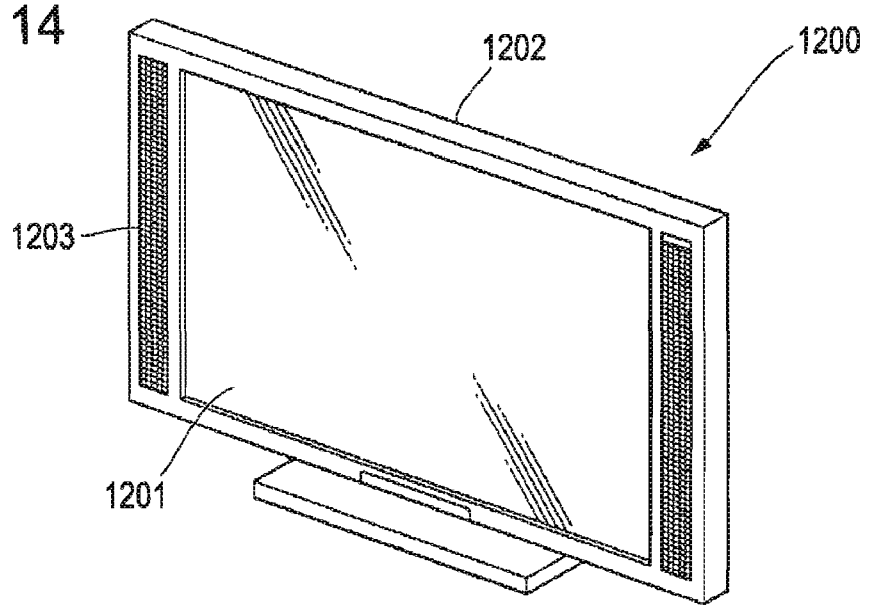
FIG. 14 is a perspective view of an image monitor that is an example of an electronic apparatus including the display device according to the present invention.

An electronic apparatus according to the present invention will now be described. The electronic apparatus includes the display device 1. FIG. 14 shows an image monitor 1200 that is an example of the electronic apparatus. With reference to FIG. 14, the image monitor 1200 includes a display section 1201 including the display device 1, a housing 1202, and a speaker 1203. Since the image monitor 1200 includes the display device 1, the image monitor 1200 can display a uniform, bright image. Pixels used for large-size display panels are large in size; hence, it is difficult to uniformly form organic functional layers emitting light. However, in the display device 1, the functional layers 110 emitting light can be uniformly formed. Accordingly, the display device 1 is suitable for such large-size display panels.

The display device 1 is suitable for image display units for electronic books, personal computers, digital still cameras, viewfinder-type or direct view-type video tape recorders, car navigation systems, pagers, electronic notebooks, portable electronic calculators, word processors, work stations, video phones, point-of-sale (POS) terminals, or apparatuses having touch panels other than display section 1201.

The preferred embodiments of the present invention are as described above with reference to the accompanying drawings. The present invention is not limited to the embodiments. The configurations and/or combinations of the members described in the embodiments for exemplification and may be modified within the scope of the present invention.

The entire disclosure of Japanese Application No. 2006-140207, filed May 19, 2006 is expressly incorporated by reference herein.

What is claimed is:

1. A method for forming a film by providing a liquid containing a functional material in a region surrounded by a bank, comprising:
forming an electrode having a center portion thicker than its peripheral portions;
forming the bank on the peripheral portions of the electrode;
forming a groove defined by a side of the bank and a side of the center portion of the electrode and extending along the periphery of the center portion of the electrode;
providing the liquid in the region; and
drying the liquid to form the film, the film being made of the functional material and being disposed over the groove.

2. The film-forming method according to claim 1, wherein the bank is formed during the formation of the groove.

3. The film-forming method according to claim 1, further comprising forming a lyophilic region having affinity to the liquid by surface-treating the bank in advance of providing the liquid in the region.

4. The film-forming method according to claim 3, wherein the bank includes a lyophilic layer having affinity to the liquid and a lyophobic layer having non-affinity to the liquid and the lyophilic region is a portion of the lyophilic layer that is exposed at a surface of the bank.

5. The film-forming method according to claim 4, wherein the bank is formed in such a manner that the lyophilic layer is formed, the lyophobic layer is formed on the lyophilic layer, the lyophobic layer is patterned, and the lyophilic layer is patterned using the resulting lyophobic layer as a mask.

6. The film-forming method according to claim 4, wherein the lyophilic layer has substantially the same thickness as that of the film.

7. A method for manufacturing a device, comprising:
forming a film by providing a liquid in a region surrounded by a bank,
wherein the film is formed by the film-forming method according to claim 1.

8. The device-manufacturing method according to claim 7, wherein the device includes the film and the electrode underlying the film and the groove is formed by partly removing the electrode.

9. The device-manufacturing method according to claim 8, wherein the electrode is partly removed in such a manner that a surface portion is removed from the electrode.

10. The device-manufacturing method according to claim 7, wherein the device includes the film and the electrode underlying the film and the groove is formed by partly removing the bank.

11. The device-manufacturing method according to claim 7, wherein the device includes the film and the electrode underlying the film and the film is formed in such a manner that a hole injection/transport layer is formed by providing a first composition containing a material for forming the hole injection/transport layer in the region surrounded by the bank and a light-emitting layer is formed by providing a second composition containing a material for forming the light-emitting layer on the hole injection/transport layer.

* * * * *